(12) United States Patent
Kim et al.

(10) Patent No.: US 11,361,985 B2
(45) Date of Patent: Jun. 14, 2022

(54) SUBSTRATE SUPPORTING DEVICE AND SUBSTRATE PROCESSING APPARATUS

(71) Applicant: JUSUNG ENGINEERING CO., LTD., Gwangju-si (KR)

(72) Inventors: Jong Sik Kim, Gwangju-si (KR); Hyun Wook Shin, Gwangju-si (KR); Su Yeon Lee, Gwangju-si (KR)

(73) Assignee: JUSUNG ENGINEERING CO., LTD.

( * ) Notice: Subject to any disclaimer, the term of this patent is extended or adjusted under 35 U.S.C. 154(b) by 121 days.

(21) Appl. No.: 16/641,645

(22) PCT Filed: Aug. 20, 2018

(86) PCT No.: PCT/KR2018/009507
§ 371 (c)(1),
(2) Date: Feb. 24, 2020

(87) PCT Pub. No.: WO2019/045340
PCT Pub. Date: Mar. 7, 2019

(65) Prior Publication Data
US 2021/0162562 A1 Jun. 3, 2021

(30) Foreign Application Priority Data

Aug. 30, 2017 (KR) .................. 10-2017-0110380
May 8, 2018 (KR) .................. 10-2018-0052665

(51) Int. Cl.
*H01L 21/00* (2006.01)
*H01L 21/687* (2006.01)
*H01L 21/683* (2006.01)

(52) U.S. Cl.
CPC ...... *H01L 21/68771* (2013.01); *H01L 21/683* (2013.01); *H01L 21/68785* (2013.01)

(58) Field of Classification Search
None
See application file for complete search history.

(56) References Cited

U.S. PATENT DOCUMENTS

2013/0213300 A1* 8/2013 Sung .................. B05C 13/02
118/712

FOREIGN PATENT DOCUMENTS

| KR | 20080024820 | * | 3/2008 | .......... H01L 21/683 |
| KR | 20080024820 A | | 3/2008 | |
| KR | 20090021031 A | | 2/2009 | |
| KR | 20090021033 | * | 2/2009 | ............ H01L 21/20 |
| KR | 20090021033 A | | 2/2009 | |
| KR | 20130094601 A | | 8/2013 | |
| KR | 20160081439 | * | 7/2016 | .......... H01L 21/687 |
| KR | 20160081439 A | | 7/2016 | |
| TW | 201448111 A | | 12/2014 | |

* cited by examiner

*Primary Examiner* — Reema Patel
(74) *Attorney, Agent, or Firm* — Renaissance IP Law Group LLP

(57) ABSTRACT

The present invention relates to a substrate supporting device and a substrate processing apparatus. The substrate supporting device, the substrate supporting device of the substrate processing apparatus, may include: a disk; and a plurality of substrate supporting parts disposed radially from a center of the disk, a substrate being supported by each of the plurality of substrate supporting parts. An upper surface of each of the plurality of substrate supporting parts may protrude more upward than an upper surface of the disk.

10 Claims, 9 Drawing Sheets

SUBSTRATE SUPPORTING DEVICE AND SUBSTRATE PROCESSING APPARATUS

TECHNICAL FIELD

The present invention relates to a substrate processing apparatus which performs a processing process, including a deposition process, an etching process, and the like, on a substrate.

BACKGROUND ART

Generally, a thin-film layer, a thin-film circuit pattern, or an optical pattern should be formed on a substrate for manufacturing a solar cell, a semiconductor device, a flat panel display device, etc. To this end, a processing process is performed on a substrate, and examples of the processing process include a thin film deposition process of depositing a thin film including a specific material on a substrate, a photo process of selectively exposing a portion of a thin film by using a photosensitive material, an etching process of removing the selectively exposed portion of the thin film to form a pattern, etc. The processing process is performed on a substrate by a substrate processing apparatus.

FIG. 1 is a side cross-sectional view schematically illustrating a portion of a related art substrate processing apparatus.

Referring to FIG. 1, a chamber 11 providing a space which a substrate S is loaded into and processed in, a disk 12 which a plurality of substrates S are mounted on and supported by, and a distribution unit (not shown) distributing a gas toward the disk 12 are installed in a related art substrate processing apparatus 10. The disk 12 is installed in the chamber 11. The distribution unit distributes the gas to the substrate S, and thus, a processing process is performed on the substrate S supported by the disk 12.

Here, in the related art substrate processing apparatus 10, an upper surface S1 of the substrate S is disposed on the same plane as an upper surface 121 of the disk 12. That is, the upper surface S1 of the substrate S and the upper surface 121 of the disk 12 are disposed at the same height. Therefore, in the related art substrate processing apparatus 10, a gas is not smoothly exhausted through a space between the disk 12 and the chamber 11, causing the degradation in quality of a thin film which has undergone a processing process including a deposition process, an etching process, and the like.

DISCLOSURE

Technical Problem

To accomplish the above-described objects, the present invention may include below-described elements.

A substrate supporting device according to the present invention, a substrate supporting device of a substrate processing apparatus, may include: a disk; and a plurality of substrate supporting parts disposed radially from a center of the disk, a substrate being supported by each of the plurality of substrate supporting parts. An upper surface of each of the plurality of substrate supporting parts may protrude more upward than an upper surface of the disk.

A substrate processing apparatus according to the present invention may include: a chamber; a gas distribution unit supplying a processing gas to an inner portion of the chamber; and a substrate supporting device, a plurality of substrates being supported by the substrate supporting device. The substrate supporting device may include a disk and a plurality of substrate supporting parts disposed radially from a center of the disk. An upper surface of each of the plurality of substrate supporting parts may protrude more upward than an upper surface of the disk.

Technical Solution

The present invention is devised to solve the above-described problems and is for providing a substrate supporting device and a substrate processing apparatus, which can smoothly exhaust a gas supplied to the inside of a chamber.

Advantageous Effect

According to the present invention, the following effects can be obtained.

The present invention is implemented to smoothly exhaust a processing gas, and thus, can decrease the amount of a processing gas which remains after being used for a processing process performed on a substrate, thereby enhancing the quality of a thin film which has undergone a processing process including a deposition process, an etching process, and the like.

MODE FOR INVENTION

Hereinafter, embodiments of a substrate processing apparatus according to the present invention will be described in detail with reference to the accompanying drawings. A substrate supporting device according to the present invention may be included in a substrate processing apparatus according to the present invention, and thus, will be described together while describing embodiments of the substrate processing apparatus according to the present invention.

Figure 1:
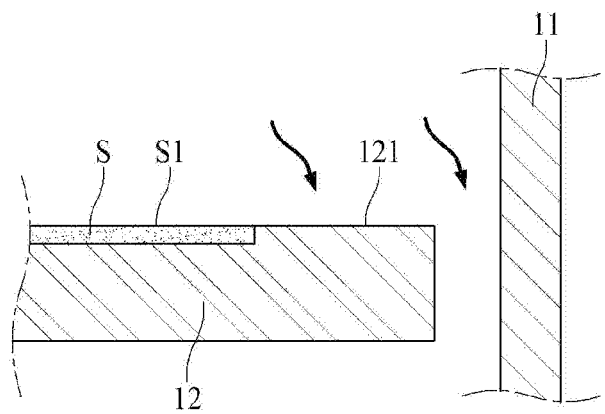
FIG. 1 is a side cross-sectional view schematically illustrating a portion of a related art substrate processing apparatus.
Figure 2:
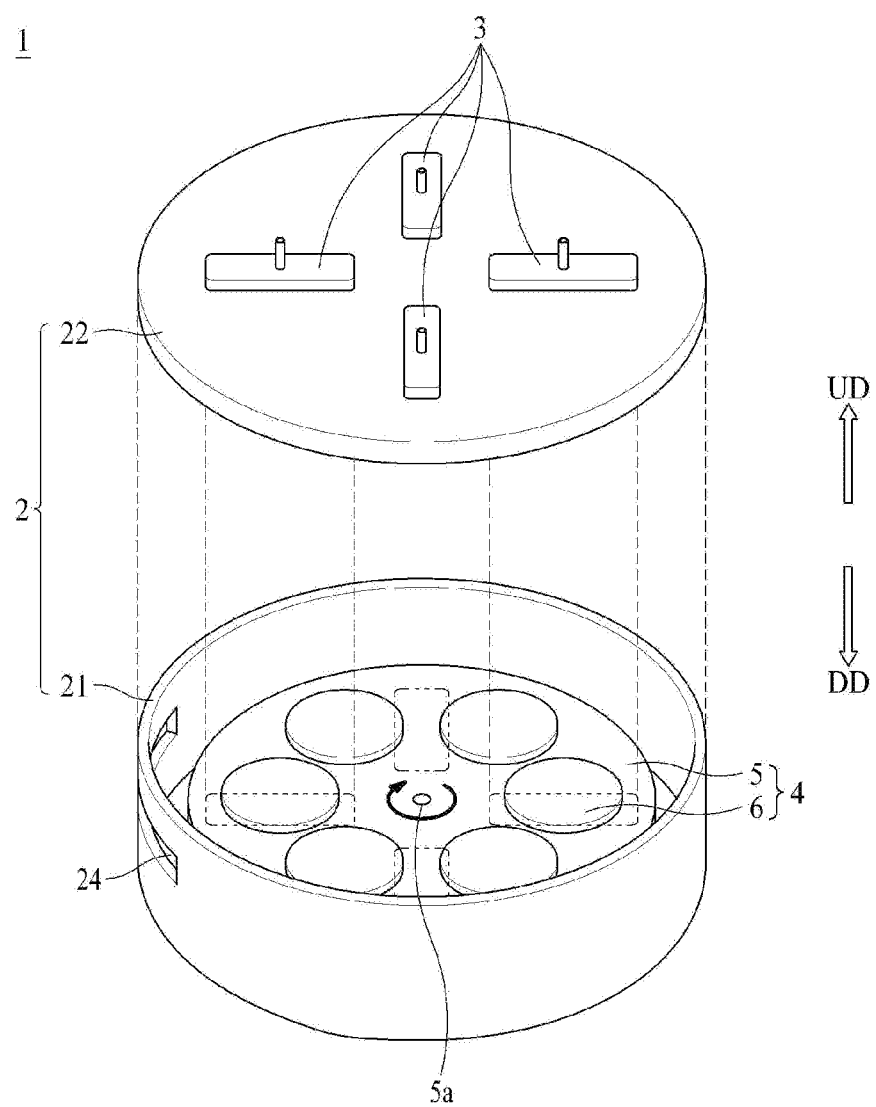
FIG. 2 is a schematic exploded perspective view of a substrate processing apparatus according to the present invention.
Figure 3:
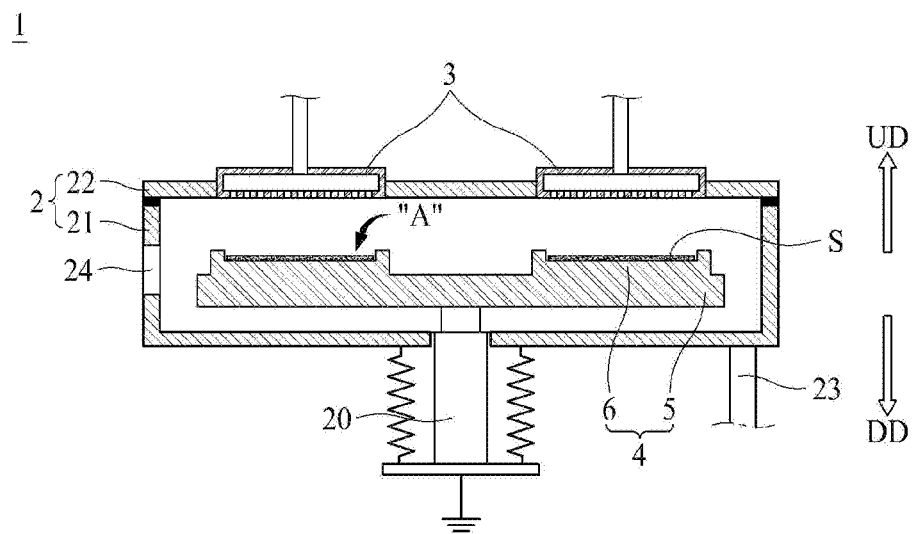
FIG. 3 is a schematic side cross-sectional view of a substrate processing apparatus according to the present invention.
Figure 4:
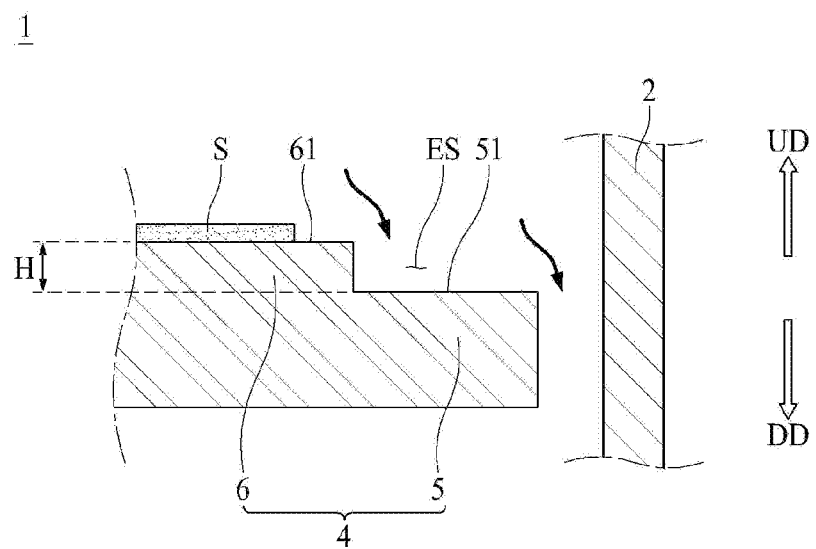
FIG. 4 is a side cross-sectional view schematically illustrating a portion of a substrate processing apparatus according to the present invention.

Referring to FIGS. 2 to 4, a substrate processing apparatus 1 according to the present invention performs a processing process on a substrate S. For example, the substrate processing apparatus 1 according to the present invention may perform at least one of a deposition process of depositing a thin film on the substrate S and an etching process of removing a portion of the thin film deposited on the substrate S. For example, the substrate processing apparatus 1 according to the present invention may perform a deposition process such as a chemical vapor deposition (CVD) process or an atomic layer deposition (ALD) process. The substrate processing apparatus 1 according to the present invention includes a chamber 2, a gas distribution unit 3, and a substrate supporting device 4.

Referring to FIGS. 2 and 3, the chamber 2 provides a processing space where the processing process is performed. The gas distribution unit 3 may be coupled to the chamber 2.

The chamber 2 may include a body 21 of which an upper surface is opened and a lid 22 coupled to an opened upper end surface of the body 21. The body 21 and the lid 22 may be coupled to each other and may be respectively disposed in a relatively lower portion (a DD arrow direction) and a relatively upper portion (a UD arrow direction). Therefore, a lower portion of the chamber 2 may correspond to the body 21, and an upper portion of the chamber 2 may correspond to the lid 22. The lid 22 may be coupled to the body 21 and may seal the processing space. The lid 22 and the chamber 2 may each be provided in a cylindrical structure as illustrated in FIG. 2, but without being limited thereto, the lid 22 and the chamber 2 may each be provided in an elliptical structure, a polygonal structure, or the like.

An exhaust port 23 for exhausting a gas and the like remaining in the processing space may be installed in the chamber 2. The exhaust port 23 may be installed in the body 21 of the chamber 2.

A substrate entrance 24 may be provided in the chamber 2. The substrate entrance 24 is a path through which the substrate S moves in/out. The substrate S may be loaded into the chamber 2 and may be unloaded to the outside of the chamber 2 through the substrate entrance 24. The substrate entrance 24 may be opened or closed by an opening/closing unit (not shown). The substrate entrance 24 may be provided in the body 21 of the chamber 2.

Referring to FIGS. 2 to 4, the gas distribution unit 3 distributes a processing gas. The gas distribution unit 3 may be coupled to the lid 22 and may distribute the processing gas toward a disk 5 and a substrate supporting part 6. Therefore, the gas distribution unit 3 may distribute the processing gas toward the substrate S supported by the substrate supporting parts 6 The gas distribution unit 3 may be coupled to the lid 22 so as to be supported by (the UD arrow direction) the substrate supporting part 6. The gas distribution unit 3 may include a plurality of gas distribution modules. At least one of the gas distribution modules may distribute a source gas. At least one of the gas distribution modules may distribute a reactant gas. At least one of the gas distribution modules may distribute a purge gas. The gas distribution modules may be coupled to the lid 22 at positions spaced apart from one another. Therefore, the gas distribution modules may distribute the processing gas to different spaces. The processing gas distributed by the gas distribution unit 3 may be used for the processing process, may move to a space between the disk 5 and the chamber 2 subsequently, and may be exhausted to the outside of the chamber 2 through the exhaust port installed in the chamber 2.

Referring to FIGS. 2 to 4, the substrate supporting device 4 supports the substrate S. A plurality of substrates S may be supported by the substrate supporting device 4. The substrate supporting device 4 may be disposed in the chamber 2. The substrate supporting device 4 may be coupled to the chamber 2 so as to be placed in a lower portion (the DD arrow direction) of the gas distribution unit 3.

The substrate supporting device 4 may be implemented as a substrate supporting device according to the present invention. The substrate supporting device 4 may include the disk 5 and a plurality of substrate supporting parts 6.

Referring to FIGS. 2 to 4, the disk 5 supports the substrate supporting parts 6. The disk 5 may support the substrate supporting parts 6 to support the substrates S which are respectively and supported by the substrate supporting parts 6. The disk 5 may be coupled to the chamber 2 so as to be placed in the chamber 2.

The disk 5 may be rotatably coupled to the chamber 2. The disk 5 may rotate about a center 5a corresponding to a rotational shaft. The center 5a of the disk 5 is a point spaced apart from an outer circumference surface of the disk 5 by the same distance. A rotation unit 20 (illustrated in FIG. 3) or rotating the disk 5 may be coupled to the chamber 2.

As the disk 5 rotates about the center 5a corresponding to the rotational shaft, the substrate supporting parts 6 and the substrates S supported by the substrate supporting parts 6 may revolve about the center 5a, corresponding to the rotational shaft, of the disk 5. The disk 5 may be disposed under (the DD arrow direction) the gas distribution unit 3. Therefore, when the disk 5 rotates about the center 5a corresponding to the rotational shaft, the substrates S supported by the substrate supporting parts 6 may sequentially pass through lower portions (the DD arrow direction) of the gas distribution modules of the gas distribution unit 3.

An upper surface 51 of the disk 5 may be disposed (the DD arrow direction) more downward than an upper surface 61 of the substrate supporting part 6. In this case, the upper surface 61 of the substrate supporting part 6 may protrude (the UD arrow direction) more upward than the upper surface 51 of the disk 5. Therefore, in comparison with the related art where an upper surface of a substrate and an upper surface of a disk are disposed on the same plane, the substrate processing apparatus 1 according to the present invention may secure an exhaust space ES which is wider provided on (the UD arrow direction) the disk 5. Thus, the substrate processing apparatus 1 according to the present invention may smoothly exhaust the processing gas distributed by the gas distribution unit 3, thereby decreasing the amount of a processing gas which remains after being used for the processing process performed on the substrate S. Accordingly, the substrate processing apparatus 1 according to the present invention may enhance the quality of a thin film which has undergone the processing process including a deposition process, an etching process, and the like. The processing gas distributed by the gas distribution unit 3 may be used for the processing process, may pass through a space between the disk 5 and the chamber 2 via the exhaust space ES subsequently, and may be exhausted to the outside of the chamber 2. In this case, the exhaust space ES may be disposed outside a portion, where each of the substrate supporting parts 6 is disposed, in the disk 5.

An upper surface 51 of a portion, other than a portion where the substrate supporting part 6 is disposed, of the disk 5 may be disposed (the DD arrow direction) more downward than the upper surface 61 of the substrate supporting part 6. In this case, the exhaust space ES may be disposed inward from the portion, where each of the substrate supporting parts 6 is disposed, in the disk 5 and may be disposed outward from the portion, where each of the substrate supporting parts 6 is disposed, in the disk 5. An exhaust port (not shown) for exhausting the processing gas may be installed inward from the portion, where each of the substrate supporting parts 6 is disposed, in the disk 5. The exhaust port may be installed to be connected to the center 5a of the disk 5.

A height difference H between the upper surface 51 of the disk 5 and the upper surface 61 of the substrate supporting part 6 may be more than 3 mm and less than 30 mm. When the height difference H is 3 mm or less, a size of the exhaust space ES is reduced, and due to this, it is difficult to smoothly exhaust the processing gas. When the height difference H is 30 mm or more, the size of the exhaust space S increases, and due to this, the amount of a processing gas exhausted without being used for the processing process increases, causing the waste of the processing gas. Since the substrate processing apparatus 1 according to the present invention is implemented so that the height difference H is more than 3 mm and less than 30 mm, the substrate processing apparatus 1 may smoothly exhaust the processing gas, and simultaneously, may decrease the amount of a wasted processing gas.

Figure 5:
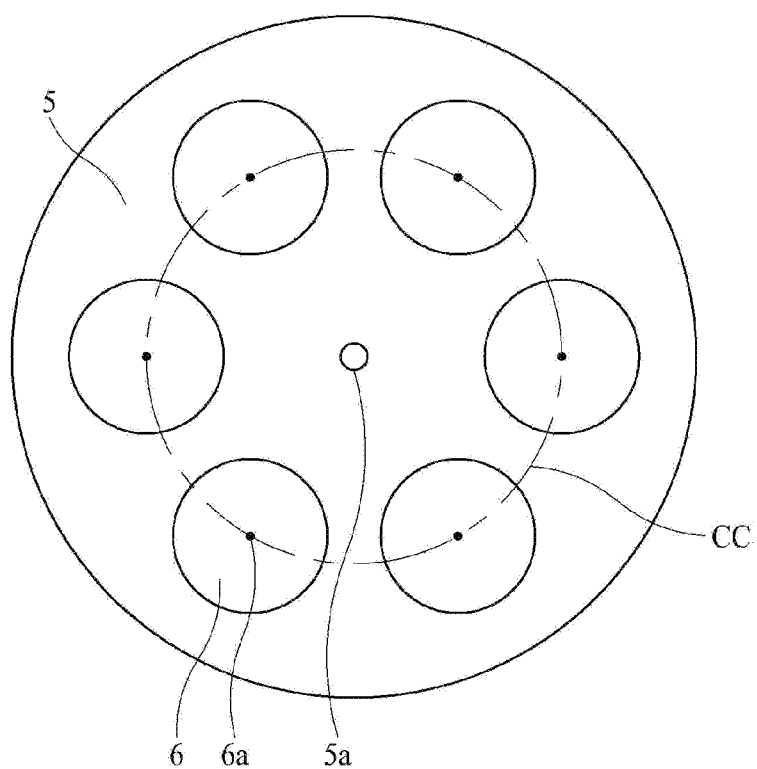
FIG. 5 is a conceptual plan view of each of a disk and substrate supporting parts in a substrate processing apparatus according to the present invention.

Referring to FIGS. 2 to 5, the substrate supporting parts 6 respectively supports the substrates S. The substrates S may be supported by the substrate supporting parts 6 and may be respectively supported by the substrate supporting parts 6. The substrate supporting parts 6 may be disposed radially from the center 5a of the disk 5. In this case, the substrate supporting parts 6 may be spaced apart from one another at the same angle with respect to the center 5a of the disk 5. When six substrate supporting parts 6 are disposed on the disk 5 as illustrated in FIG. 5, the substrate supporting parts 6 may be disposed so as to be spaced apart from one another by 60 degrees with respect to the center 5a of the disk 5.

Centers 6a (illustrated in FIG. 5) of the substrate supporting parts 6 may be provided on a concentric circle CC centered on the center 5a of the disk 5. Therefore, the substrate processing apparatus 1 according to the present invention may be implemented to provide the same process environment to the substrates S which are respectively and supported by the substrate supporting parts 6. The centers 6a of the substrate supporting parts 6 are points spaced apart from outer circumference surfaces of the substrate supporting parts 6 by the same distance.

Upper surfaces 6a of the substrate supporting parts 6 may protrude (the UD arrow direction) more upward than the upper surface 5a of the disk 5. Therefore, the substrate processing apparatus 1 according to the present invention is implemented so that a size of the exhaust space ES increases, and thus, the processing gas is smoothly exhausted. The substrate supporting parts 6 and the disk 5 may be provided as one body.

Figure 9:
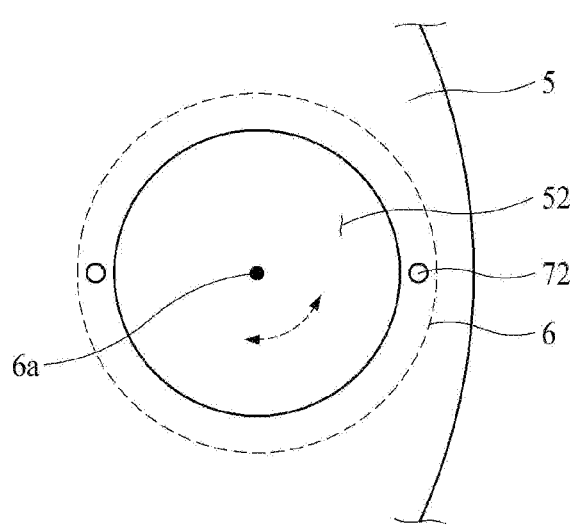
FIGS. 9 and 10 are conceptual plan views for describing an alignment part in a substrate processing apparatus according to the present invention.

Referring to FIGS. 2 to 9, each of the substrate supporting parts 6 may be implemented to be detachable from the disk 5. In FIG. 9, each of the substrate supporting parts 6 is illustrated as a dotted line, but this is for convenience of description. Accordingly, the substrate processing apparatus 1 according to the present invention may have the following effects.

First, the substrate processing apparatus 1 according to the present invention may be implemented in order for a maintenance process such as replacement or repair to be individually performed on only a damaged or broken-down substrate supporting part 6 of the substrate supporting parts 6. Accordingly, the substrate processing apparatus 1 according to the present invention may decrease the cost expended in the maintenance process and may reduce a time taken in the maintenance process, thereby increasing an operation rate.

Second, as illustrated in FIG. 9, the substrate processing apparatus 1 according to the present invention may rotate the substrate supporting part 6 independently of the disk 5, so as to change a direction in which the substrate supporting part 6 faces. When the substrate supporting part 6 rotates with respect to the center 6a of the substrate supporting part 6 and thus the substrate S supported by the substrate supporting part 6 rotates together, a portion, facing the center 5a of the disk 5, of the substrate S supported by the substrate supporting part 6 may be changed. Accordingly, the substrate processing apparatus 1 according to the present invention may enhance the uniformity of a thickness of a thin film disposed on the substrate S.

For example, in a state where the substrate S is supported by the substrate supporting part 6, the disk 5 may rotate about the center 5a corresponding to a rotational shaft to perform the processing process at a first cycle, and then, the substrate supporting part 6 may rotate the center 6a corresponding to a rotational shaft to rotate by 180 degrees. Subsequently, the disk 5 may rotate about the center 5a corresponding to the rotational shaft to perform the processing process at a second cycle. A portion facing the center 5a of the disk 5 when performing the processing process at the first cycle may be disposed to face an outer portion of the disk 5 when performing the processing process at the second cycle. Therefore, the substrate processing apparatus 1 according to the present invention may change a portion, facing the center 5a of the disk 5, of the substrate S supported by the substrate supporting part 6 in a process of performing the processing process, thereby compensating for a process environment difference which partially occurs for the substrate S.

Although not shown, the substrate processing apparatus 1 according to the present invention may include a direction change unit which raises and rotates the substrate supporting part 6. The direction change unit may raise the substrate supporting part 6 in order for the substrate supporting part 6 to be separated from the disk 5, and then, may rotate the substrate supporting part 6 to change a direction of the substrate S. Subsequently, the direction change unit may lower the substrate supporting part 6 to place the substrate S on the disk 5. The direction change unit may be coupled to the chamber 2 so as to be placed under (the DD arrow direction) the substrate supporting part 6. When the substrate supporting part 6 are provided in plurality, the substrate processing apparatus 1 according to the present invention may include a plurality of direction change units equal to the number of substrate supporting parts 6.

The substrate supporting parts 6 may be implemented to be detachable from the disk 5 through a plurality of insertion parts 52 provided in the disk 5.

The insertion parts 52 may be disposed radially from the center 5a of the disk 5. In this case, the insertion parts 52 may be disposed so as to be spaced apart from one another at the same angle with respect to the center 5a of the disk 5. The insertion parts 52 may be provided to pass through the disk 5. The insertion parts 52 may be formed by processing grooves to a certain depth in the disk 5. The substrate processing apparatus 1 according to the present invention may include a same number of insertion parts 52 and substrate supporting parts 6.

One of the insertion parts 52 may be connected or separated to or from one of the substrate supporting parts 6. Therefore, each of the substrate supporting parts 6 may be implemented to be detachable from the disk 5. One of the substrate supporting parts 6 may be assigned for each of the insertion parts 52. In this case, a portion of the substrate supporting part 6 may be inserted into the insertion part 52. Therefore, the substrate supporting part 6 may be supported by a supporting surface 53 of the disk 5, and thus, may be maintained with being inserted into the insertion part 52. The supporting surface 53 is a surface which is disposed to face the insertion part 52 as the insertion part 52 is provided in the disk 5. The supporting surface 53 may be provided in a circular ring shape.

Each of the insertion parts 52 may be provided to have a first internal diameter 521 (illustrated in FIG. 6) in the upper surface 51 of the disk 5 and to have a second internal diameter 522 (illustrated in FIG. 6) in a lower surface of the disk 5 below the upper surface 51 of the disk 5. The first internal diameter 521 may be provided greater than the second internal diameter 522. Therefore, the supporting surfaces 53 may be provided to be inclined with respect to the upper surface 51 of the disk 5. The supporting surfaces 53 may be slopingly provided to be closer to the center 6a of the substrate supporting part 6 as the supporting surfaces 53 progressively extends to a lower portion (the DD arrow direction). Thus, as illustrated in FIG. 7, even when the substrate supporting part 6 is disposed to deviate from the insertion part 52, the substrate supporting part 6 may be induced by a self-weight so that the substrate supporting part 6 moves along a slope of the supporting surface 53 and is placed at an accurate position. That is, the insertion parts 52 and the supporting surfaces 53 may have a centering function of inducing the substrate supporting part 6 to be placed at an accurate position. Therefore, the substrate processing apparatus 1 according to the present invention may be implemented so that, by inducing each of the substrate supporting parts 6 to be placed at an accurate position, the same process environment is provided to the substrates S supported by the substrate supporting parts 6. In this case, the insertion parts 52 and the supporting surfaces 53 may induce the substrate supporting parts 6 in order for the centers 6a of the substrate supporting parts 6 to be disposed in the concentric circle CC (illustrated in FIG. 5) in the center 5a of the disk 5. At least one of the supporting surfaces 53 may be provided to be inclined with respect to the upper surface 51 of the disk 5.

Each of the substrate supporting parts 6 may include a centering member 62 which protrudes from a lower surface thereof to a lower portion (the DD arrow direction). The centering members 62 may be provided to have a diameter which is reduced as the centering members 62 progressively protrudes to the lower portion (the DD arrow direction). The centering members 62 may be respectively inserted into the insertion parts 52 and may be respectively supported by the supporting surfaces 53. In this case, each of the supporting surfaces 53 may be slopingly provided to have a diameter which is reduced as a corresponding supporting surface 53 progressively extends to the lower portion (the DD arrow direction). Therefore, as illustrated in FIG. 7, when the substrate supporting part 6 is disposed to deviate from the insertion part 52, the substrate processing apparatus 1 according to the present invention may induce the substrate supporting part 6 to move to an accurate position by using the centering member 62 and the supporting surface 53. That is, the substrate processing apparatus 1 according to the present invention may more reinforce the centering function by using a slope of each of the centering member 62 and the supporting surface 53.

The substrate supporting parts 6 may each include an inclined surface 621. The inclined surfaces 621 respectively contact the supporting surfaces 53. The inclined surfaces 621 may respectively correspond to outer circumference surfaces of the centering members 62. At least one of the inclined surface 621 and the supporting surface 53 may be provided to be inclined with respect to the upper surface 51 of the disk 5. When the inclined surface 621 is provided to be inclined with respect to the upper surface 51 of the disk 5, the centering function may be implemented by the inclined surface 621. When the supporting surface 53 is provided to be inclined with respect to the upper surface 51 of the disk 5, the centering function may be implemented by the supporting surface 53. When all of the inclined surface 621 and the supporting surface 53 are provided to be inclined with respect to the upper surface 51 of the disk 5, the centering function may be implemented by the inclined surface 621 and the supporting surface 53. In this case, the inclined surface 621 and the supporting surface 53 may be provided to be inclined at an angle corresponding to each other.

In a case where all of the inclined surface 621 and the supporting surface 53 are provided to be inclined with respect to the upper surface 51 of the disk 5, when the inclined surface 621 contacts the supporting surface 53, the substrate processing apparatus 1 according to the present invention may increase a length by which a gas should move for passing through a gap between the disk 5 and the substrate supporting parts 6. Therefore, the substrate processing apparatus 1 according to the present invention may be implemented so that the processing gas distributed by the gas distribution unit 3 is difficult to pass through the gap between the disk 5 and the substrate supporting parts 6. That is, the substrate processing apparatus 1 according to the present invention may reinforce a sealing function performed on the processing gas. Accordingly, the substrate processing apparatus 1 according to the present invention may more decrease the amount of a wasted processing gas. Also, in a case where a deposition process is performed, the substrate processing apparatus 1 according to the present invention may reduce a degree of contamination caused by deposition performed on an undesired portion.

Moreover, the substrate processing apparatus 1 according to the present invention may be implemented to distribute a protection gas from a portion (the DD arrow direction) under the substrate supporting parts 6. The protection gas prevents the processing gas from penetrating through the gap between the disk 5 and the substrate supporting parts 6. However, when a distributing force of the protection gas is too strong, the protection gas may pass through the gap between the disk 5 and the substrate supporting parts 6 and may affect the processing process. In this case, the substrate processing apparatus 1 according to the present invention may be implemented so that the inclined surface 621 and the supporting surface 53 are all provided to be inclined with respect to the upper surface 51 of the disk 5 and contact each other, and thus, the protection gas is difficult to pass through the gap between the disk 5 and the substrate supporting parts 6. That is, the substrate processing apparatus 1 according to the present invention may reinforce the sealing function performed on the protection gas.

Figure 6:
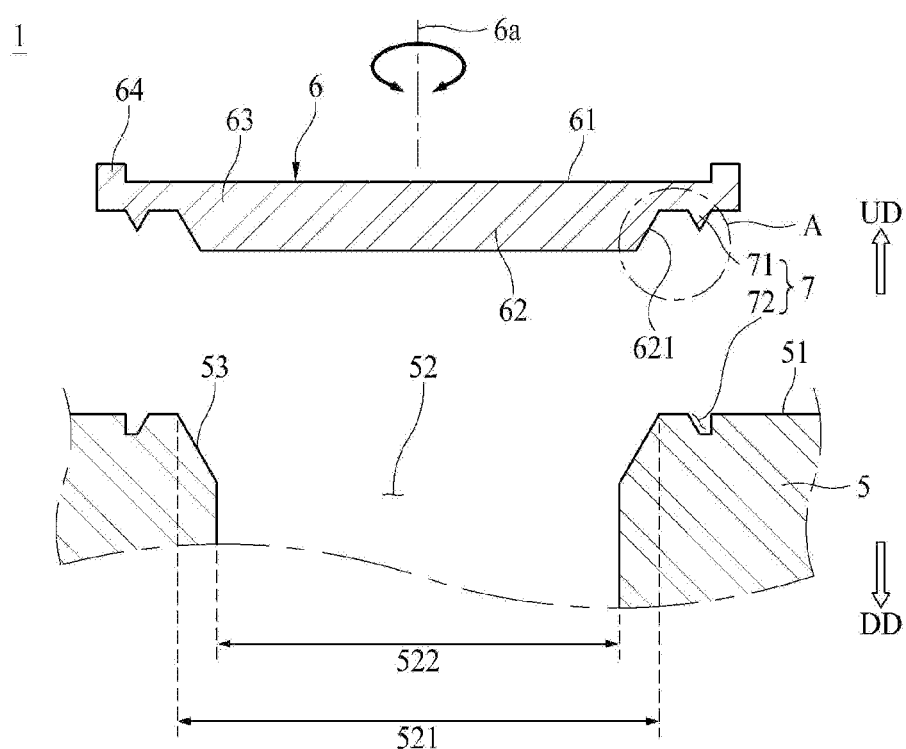
FIG. 6 is a schematic exploded side cross-sectional view of each of a substrate supporting part and a disk in a substrate processing apparatus according to the present invention.
Figure 7:
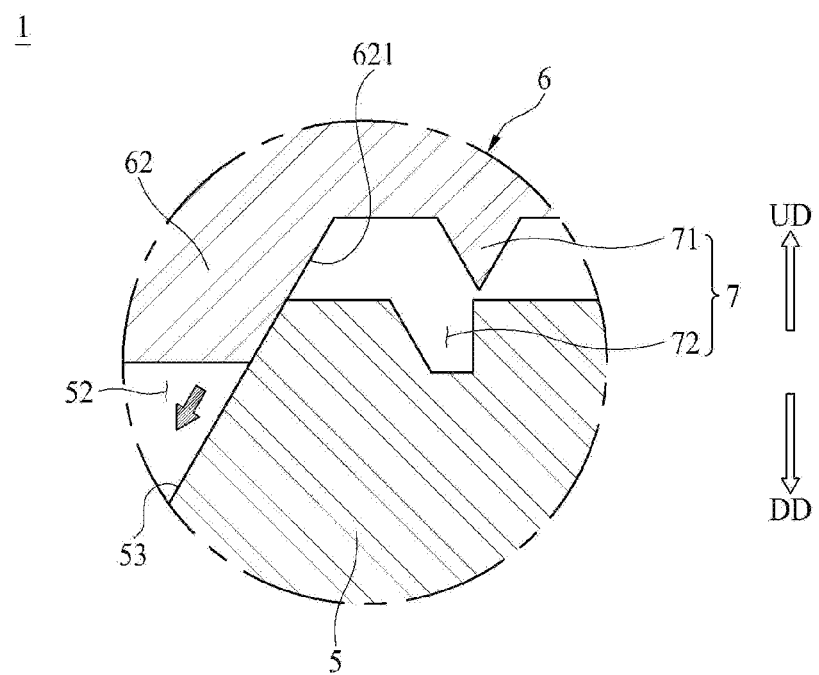
FIGS. 7 and 8 are schematic side cross-sectional views illustrating an enlarged portion A of FIG. 6 for describing a centering function.
Figure 8:
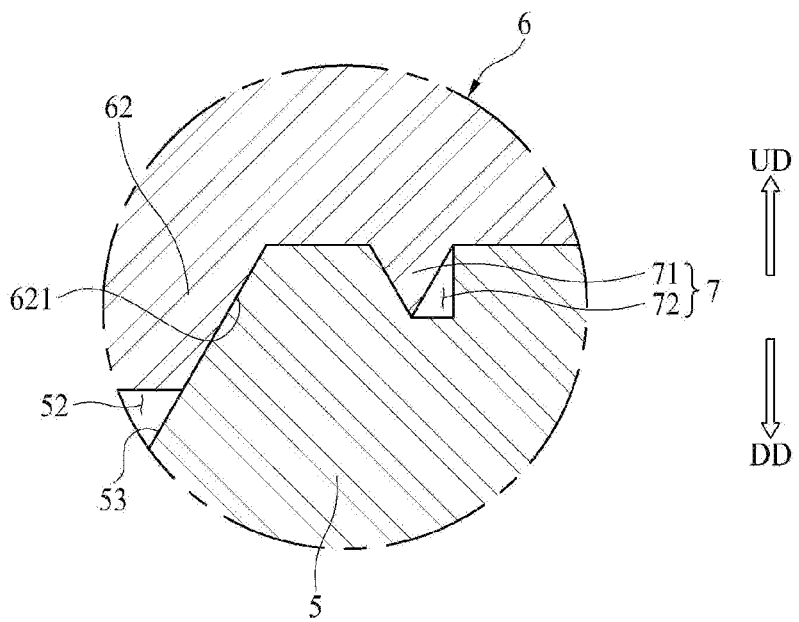
Figure 10:
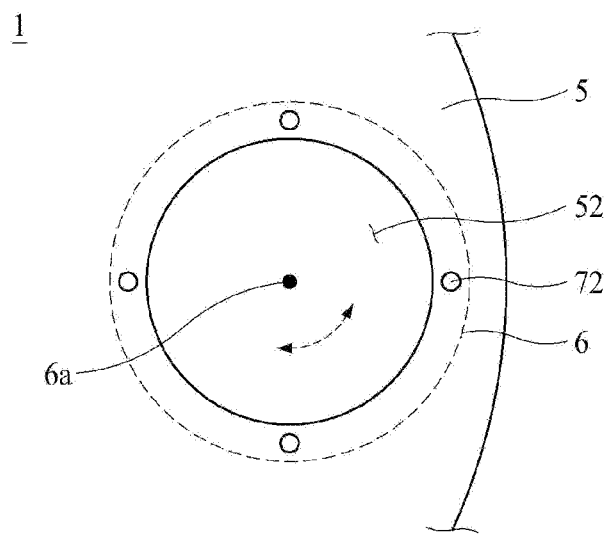

Referring to FIGS. 2 to 10, the substrate processing apparatus 1 according to the present invention may include an alignment part 17 (illustrated in FIG. 6). In FIG. 10, the substrate supporting part 6 is illustrated as a dotted line, but this is for convenience of description.

The alignment part 7 enables the substrate supporting part 6 to be coupled to the disk 5 in a certain direction. When the substrate supporting part 6 rotates in order for a direction facing the substrate supporting part 6 to be changed as illustrated in FIGS. 9 and 10, the alignment part 7 may align the substrate supporting part 6 so as to be maintained in one direction of predetermined directions. For example, the alignment part 7 may align the substrate supporting part 6 so that the substrate supporting part 6 rotates by 180 degrees so as to be changed in two directions. Therefore, in a process of performing the processing process, the substrate processing apparatus 1 according to the present invention may compensate for a processing environment difference which partially occurs for the substrate S, based on a rotation of the substrate supporting part 6 and a rotation of the substrate S supported by the substrate supporting part 6. The substrate processing apparatus 1 according to the present invention may include a plurality of alignment parts 7.

Each of the alignment parts 7 may include an alignment projection 71 and an alignment groove 72.

The alignment projections 71 may respectively protrude from lower surfaces of the substrate supporting parts 6. When the centering member 62 is included in each of the substrate supporting parts 6, the alignment projections 71 may be disposed outside the centering member 62. Therefore, the alignment projections 71 may be disposed not to interfere in insertion of the centering member 62 into the insertion part 52. Each of the alignment projections 71 may be provided in a cylindrical shape, but without being limited thereto, each of the alignment projections 71 may be provided in another shape such as a polygonal shape capable of being inserted into the alignment groove 72. Each of the alignment projections 71 may be provided to have a size which is reduced as a corresponding alignment projection 71 progressively extends to a lower portion (the DD arrow direction).

Each of the alignment grooves 72 may be provided in the disk 5. The alignment grooves 72 may be respectively provided outside the insertion parts 52. The substrate supporting parts 6 may be detachably coupled to the disk 5 according to the alignment projections being respectively inserted into the alignment grooves 72. The alignment projections 71 may be respectively inserted into the alignment grooves 72 and may be supported by the disk 5, and thus, the substrate supporting parts 6 may be maintained with being coupled to the disk 5 in a certain direction.

Here, N (where N is an integer more than one) number of alignment projections 71 may be provided in each of the substrate supporting parts 6. The alignment projections 71 may be disposed to be spaced apart from one another at the same angle with respect to the center 6a of each of the substrate supporting parts 6. In this case, N or 2N number of alignment grooves 72 may be provided outside each of the insertion parts 52 in the disk 5. Therefore, the alignment projections 71 may be inserted into different alignment grooves 72, based on an angle of a rotation performed with respect to the center 6a of each of the substrate supporting parts 6.

For example, when two alignment projections 71 are provided with respect to one substrate supporting part 6, two alignment grooves 72 may be provided outside each of the insertion parts 52 in the disk 5 as illustrated in FIG. 9. In this case, when the substrate supporting part 6 rotates by 180 degrees about the center 6a corresponding to a rotational shaft, the alignment projections 71 may be respectively inserted into the alignment grooves 72. Therefore, the substrate S supported by the substrate supporting part 6 may rotate by 180 degrees about the center 6a of the substrate supporting part 6 corresponding to the rotational shaft, and thus, a portion of the substrate S facing the center 5a of the disk 5 may be changed. The alignment grooves 72 may be disposed outside the insertion part 52 so as to be spaced apart from one another by 180 degrees with respect to the center 6a of the substrate supporting part 6. The alignment projections 71 may be disposed to be spaced apart from one another by 180 degrees with respect to the center 6a of the substrate supporting part 6.

For example, when two alignment projections 71 are provided with respect to one substrate supporting part 6, four alignment grooves 72 may be provided outside each of the insertion parts 52 in the disk 5 as illustrated in FIG. 10. In this case, when the substrate supporting part 6 rotates by 90 degrees about the center 6a corresponding to the rotational shaft, the alignment projections 71 may be respectively inserted into the alignment grooves 72. Therefore, the substrate S supported by the substrate supporting part 6 may rotate by 90 degrees about the center 6a of the substrate supporting part 6 corresponding to the rotational shaft, and thus, a portion of the substrate S facing the center 5a of the disk 5 may be changed. The alignment grooves 72 may be disposed outside the insertion part 52 so as to be spaced apart from one another by 90 degrees with respect to the center 6a of the substrate supporting part 6. The alignment projections 71 may be disposed to be spaced apart from one another by 90 degrees with respect to the center 6a of the substrate supporting part 6.

Although not shown, the alignment projections 71 may be provided in the disk 5 to respectively protrude from outer portions to upper portions (the UD arrow direction) of the insertion parts 52. In this case, the alignment grooves 72 may be respectively provided in lower surfaces of the substrate supporting parts 6.

Figure 11:
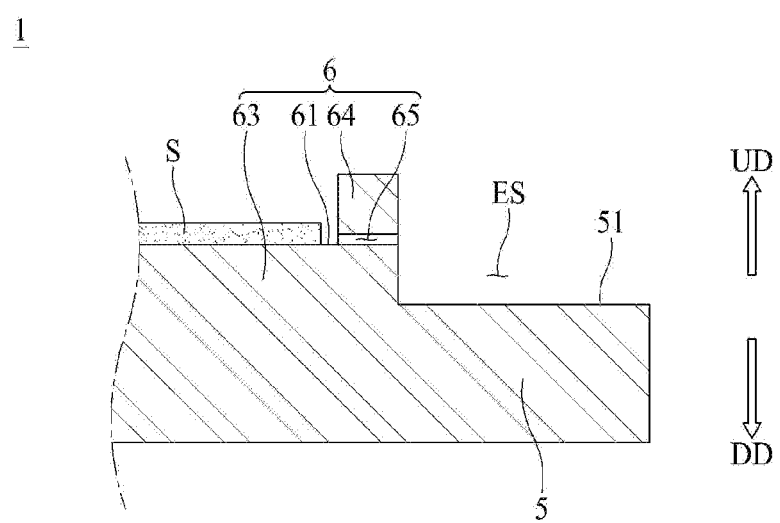
FIGS. 11 and 12 are side cross-sectional views schematically illustrating a portion of a substrate processing apparatus according to a modified embodiment of the present invention.
Figure 12:
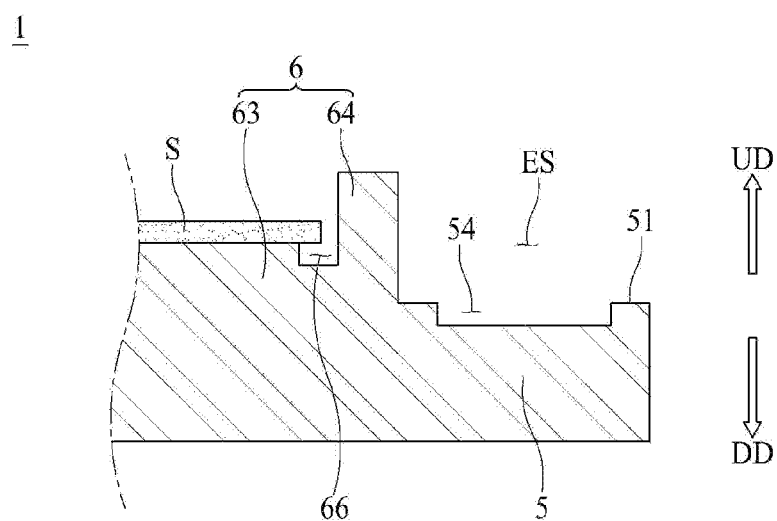

Referring to FIGS. 11 and 12, in a substrate processing apparatus 1 according to a modified embodiment of the present invention, the substrate supporting parts 6 may each include a center portion 63 and an outer stepped portion 64. In FIGS. 11 and 12, an embodiment where the substrate supporting parts 6 and the disk 5 are implemented as one body is illustrated, but without being limited thereto, the substrate supporting parts 6 and the disk 5 may also be applied to an embodiment implemented as a split type.

The center portion 63 supports a lower surface of a substrate S. The center portion 63 may be disposed inward from the outer stepped portion 64. An upper surface of the center portion 63 may protrude more upward than the upper surface 51 of the disk 5. The center portion 63 may be provided in a shape corresponding to the substrate S.

The outer stepped portion 64 supports a side surface of the substrate S. The center portion 63 and the substrate S supported by the center portion 63 may be disposed inward from the outer stepped portion 64. The outer stepped portion 64 may be provided to surround the center portion 63 and the substrate S supported by the center portion 63. For example, the outer stepped portion 64 may be provided in a circular ring shape. The outer stepped portion 64 may protrude more upward than the upper surface 51 of the center portion 63. Therefore, the outer stepped portion 64 may support the side surface of the substrate S supported by the center portion 63, thereby preventing movement of the substrate S supported by the center portion 63. The outer stepped portion 64 may be provided to have a diameter which is greater than that of the substrate S. In this case, the outer stepped portion 64 may support the side surface of the substrate S supported by the center portion 63, thereby limiting a distance by which the substrate S supported by the center portion 63 is capable of moving.

A gas flow path 65 may be provided in the outer stepped portion 64. The gas flow path 65 may be provided to communicate with each of an inner portion of the outer stepped portion 64 and the upper surface 51 of the disk 5. Therefore, a processing gas which remains inside the outer stepped portion 64 after being used for the processing process may pass through the outer stepped portion 64 via the gas flow path 65. Subsequently, the processing gas may be exhausted via the exhaust space ES. Accordingly, the substrate processing apparatus 1 according to a modified embodiment of the present invention may be implemented so that, even when the outer stepped portion 64 is provided, a processing gas is smoothly exhausted through the gas flow path 65. The gas flow path 65 may be provided to pass through the outer stepped portion 64. The gas flow path 65 may be provided in plurality in the outer stepped portion 64. In this case, the gas flow paths 65 may be disposed at positions spaced apart from one another.

The gas flow path 65 may be provided outside the concentric circle CC (illustrated in FIG. 5). Accordingly, the substrate processing apparatus 1 according to a modified embodiment of the present invention may be implemented so that a processing gas moves to an outer portion of the disk 5 without moving to the center 5a (illustrated in FIG. 5) of the disk 5 through the gas flow path 65.

The substrate supporting parts 6 may each include an edge groove 66 (illustrated in FIG. 12).

The edge groove 66 may be provided in the center portion 63. The edge groove 66 may be provided along a boundary line between the center portion 63 and the outer stepped portion 64. The edge groove 66 may accommodate the processing gas. Therefore, the substrate processing apparatus 1 according to a modified embodiment of the present invention may be implemented so that the processing gas stays in an outer portion of the substrate S supported by the center portion 63 through the edge groove 66, thereby increasing the efficiency of the processing process performed on the outer portion of the substrate S. In a case where the substrate processing apparatus 1 according to a modified embodiment of the present invention performs a deposition process, a thickness of a thin film deposited on the outer portion of the substrate S may be more thickened. In a case where the substrate processing apparatus 1 according to a modified embodiment of the present invention performs an etching process, an etching rate of a thin film disposed in the outer portion of the substrate S may more increase. The edge groove 66 may be provided in a circular ring shape.

A height of a floor surface where the edge groove 66 is provided in the center portion 63 may be implemented equal to that of the upper surface 51 of the disk 5. The height of the floor surface where the edge groove 66 is provided in the center portion 63 may be implemented lower than that of the upper surface 51 of the disk 5. In this case, the amount of a processing gas accommodated into the edge groove 66 may increase, and thus, the efficiency of the processing process performed on the outer portion of the substrate S may more increase. As described above, the substrate processing apparatus 1 according to a modified embodiment of the present invention may be implemented so that the efficiency of the processing process performed on the outer portion of the substrate S is adjusted based on a depth of the edge groove 66.

A groove 54 may be provided in the disk 5. The groove 54 may be provided in the upper surface 51 of the disk 5. Therefore, the substrate processing apparatus 1 according to a modified embodiment of the present invention may more increase a size of the exhaust space ES by using the groove 54, thereby more smoothly exhausting a processing gas. The groove 54 may be formed by processing a groove to a certain depth in the upper surface 51 of the disk 5. The groove 54 may be disposed outward from the substrate supporting parts 6 in the upper surface 51 of the disk 5. The substrate supporting parts 6 may be disposed inward from the groove 54. The groove 54 may be provided in a circular ring shape.

The present invention described above are not limited to the above-described embodiments and the accompanying drawings and those skilled in the art will clearly appreciate that various modifications, deformations, and substitutions are possible without departing from the scope and spirit of the invention.

The invention claimed is:

1. A substrate supporting device of a substrate processing apparatus, the substrate supporting device comprising:
   a disk; and
   a plurality of substrate supporting parts disposed radially from a center of the disk, wherein each of the plurality of substrate supporting parts is configured to support a substrate,
   wherein an upper surface of each of the plurality of substrate supporting parts protrudes above an upper surface of the disk,
   wherein each of the plurality of substrate supporting parts comprises a centering member protruding from a lower surface thereof to a lower portion thereunder, the centering member having a diameter which decreases as a function of distance away from the lower surface of the substrate support part to the lower portion,
   wherein the disk comprises a plurality of insertion parts formed in the upper surface thereof, wherein each insertion part of the plurality of insertion parts is configured to receive a centering member of a respective substrate supporting part of the plurality of substrate supporting parts,
   wherein the disk comprises a plurality of supporting surfaces, wherein each supporting surface is configured to support a respective centering member received within an insertion part of the plurality of insertion parts,
   wherein each of the plurality of supporting surfaces is an inclined surface extending below the upper surface of the disk and having a diameter which decreases as a function of distance away from the upper surface of the disk,
   wherein each of the plurality of substrate supporting parts comprises a plurality of alignment projections protruding from the lower surface thereof,
   wherein the disk comprises a plurality of alignment grooves provided outside each of the plurality of insertion parts, wherein each alignment groove of the plurality of alignment grooves is configured to receive an alignment projection of the plurality of alignment projections such that each of the plurality of substrate supporting parts is detachably coupled to the disk, and
   wherein each of the alignment projections decreases in size as a function of distance away from the lower surface of the substrate support part.

2. The substrate supporting device of claim 1, wherein a height difference between the upper surface of the disk and the upper surface of each of the plurality of substrate supporting parts is more than 3 mm and less than 30 mm.

3. The substrate supporting device of claim 1, wherein insertion parts of the plurality of insertion parts are disposed radially from the center of the disk, and
   wherein one of the plurality of insertion parts is detachably connected to one of the plurality of substrate supporting parts.

4. The substrate supporting device of claim 1, wherein insertion parts of the plurality of insertion parts are disposed radially from the center of the disk, and
   wherein one of the plurality of substrate supporting parts is assigned for each of the plurality of insertion parts, and a portion of the one of the plurality of substrate supporting parts is inserted into a corresponding insertion part.

5. The substrate supporting device of claim 1, wherein centers of the plurality of substrate supporting parts are arranged in a concentric circle around the center of the disk.

6. The substrate supporting device of claim 4, wherein each of the plurality of insertion parts is provided to have a first internal diameter in the upper surface of the disk and to have a second internal diameter in a lower surface of the disk below the upper surface of the disk, and the first internal diameter is greater than the second internal diameter.

7. The substrate supporting device of claim 1, wherein
   N (where N is an integer more than one) number of alignment projections are provided in each of the plurality of substrate supporting parts,
   N or 2N number of alignment grooves are provided outside each of the plurality of insertion parts in the disk, and
   the plurality of alignment projections are disposed to be spaced apart from one another at the same angle with respect to a center of each of the plurality of substrate supporting parts, and the plurality of alignment projections are inserted into different alignment grooves, based on an angle of a rotation performed with respect to the center of each of the plurality of substrate supporting parts.

8. The substrate supporting device of claim 1, wherein each of the plurality of substrate supporting parts comprises a center portion configured to support a lower surface of the substrate and an outer stepped portion configured to support a side surface of the substrate.

9. The substrate supporting device of claim 8, wherein
   at least one gas flow path is provided in the outer stepped portion, and
   the gas flow path communicates with each of an inner portion of the outer stepped portion and the upper surface of the disk.

10. The substrate supporting device of claim 9, wherein
    centers of the plurality of substrate supporting parts are arranged in a concentric circle around the center of the disk, and
    the gas flow path is provided outside the concentric circle.

* * * * *